US008659107B2

(12) United States Patent
Butendeich et al.

(10) Patent No.: US 8,659,107 B2
(45) Date of Patent: Feb. 25, 2014

(54) RADIATION RECEIVER AND METHOD OF PRODUCING A RADIATION RECEIVER

(75) Inventors: Rainer Butendeich, Regensburg (DE); Reiner Windisch, Pettendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 118 days.

(21) Appl. No.: 12/746,121

(22) PCT Filed: Dec. 17, 2008

(86) PCT No.: PCT/DE2008/002126
§ 371 (c)(1),
(2), (4) Date: Jun. 24, 2010

(87) PCT Pub. No.: WO2009/094966
PCT Pub. Date: Aug. 6, 2009

(65) Prior Publication Data
US 2010/0258892 A1     Oct. 14, 2010

(30) Foreign Application Priority Data

Jan. 31, 2008   (DE) .................... 10 2008 006 987

(51) Int. Cl.
*H01L 27/148*  (2006.01)
(52) U.S. Cl.
USPC ............ 257/440; 257/443; 257/94; 257/96; 257/97; 257/E51.026; 257/E31.001; 257/E31.003; 257/E31.01; 257/E31.012; 257/E31.017; 257/E31.037; 257/E31.039; 257/E31.053; 257/E31.061

(58) Field of Classification Search
USPC ............ 257/440, 443, 96, 94, 97, E51.026, 257/E31.001, E31.002, E31.003, E31.01, 257/E31.012, E31.017, E31.024, E31.037, 257/E31.039, E31.053, E31.061

See application file for complete search history.

(56) References Cited

U.S. PATENT DOCUMENTS

| | | |
|---|---|---|
| 4,496,788 A | 1/1985 | Hamakawa et al. |
| 4,677,289 A | 6/1987 | Nozaki et al. |
| 4,820,915 A | 4/1989 | Hamakawa et al. |
| 4,894,526 A * | 1/1990 | Bethea et al. ............ 250/214.1 |
| 5,107,319 A * | 4/1992 | Lauterbach et al. ......... 257/257 |
| 5,518,934 A | 5/1996 | Forrest et al. |
| 5,552,603 A | 9/1996 | Stokes |

(Continued)

FOREIGN PATENT DOCUMENTS

DE       35 33 146 A1    3/1987
DE  10 2004 037 020 A1   8/2005

(Continued)

OTHER PUBLICATIONS

Poynton, C., "Sensing Color with the TAOS TCS230," Texas Advanced Optoelectronic Solutions, May 17, 2005, pp. 1-15, Plano, TX, USA.

*Primary Examiner* — Michael Shingleton
(74) *Attorney, Agent, or Firm* — Slater & Matsil, L.L.P.

(57) ABSTRACT

A radiation receiver has a semiconductor body including a first active region and a second active region, which are provided in each case for detecting radiation. The first active region and the second active region are spaced vertically from one another. A tunnel region is arranged between the first active region and the second active region. The tunnel region is connected electrically conductively with a land, which is provided between the first active region and the second active region for external electrical contacting of the semiconductor body. A method of producing a radiation receiver is additionally indicated.

15 Claims, 7 Drawing Sheets

(56) References Cited

U.S. PATENT DOCUMENTS

| | | |
|---|---|---|
| 6,091,126 A | 7/2000 | Costard et al. |
| 6,184,538 B1 | 2/2001 | Bandara et al. |
| 6,822,991 B2 | 11/2004 | Collins, III et al. |
| 7,271,405 B2 * | 9/2007 | Krishna et al. .................. 257/21 |
| 7,525,083 B2 | 4/2009 | Jaeger et al. |
| 7,692,202 B2 * | 4/2010 | Bensch ........................ 257/96 |
| 7,821,807 B2 * | 10/2010 | Velicu et al. .................. 365/115 |
| 2005/0067627 A1 | 3/2005 | Shen et al. |
| 2006/0042677 A1 | 3/2006 | Fukunaga et al. |
| 2006/0118914 A1 | 6/2006 | Yoo |
| 2006/0162768 A1 | 7/2006 | Wanlass et al. |
| 2008/0237633 A1 | 10/2008 | Jaeger et al. |
| 2008/0251117 A1 | 10/2008 | Schubert et al. |
| 2009/0315048 A1 | 12/2009 | Fehrer et al. |

FOREIGN PATENT DOCUMENTS

| | | |
|---|---|---|
| DE | 10 2005 001 280 A1 | 4/2006 |
| DE | 10 2005 043 918 A1 | 12/2006 |
| DE | 10 2008 016 100 A1 | 10/2009 |
| EP | 1 643 565 A2 | 4/2006 |
| GB | 2 228 824 A | 9/1990 |
| JP | 58-105569 | 6/1983 |
| JP | 2006-013531 A | 1/2006 |
| JP | 2007-520071 A | 7/2007 |
| TW | I396293 | 5/2013 |
| WO | WO 03/073517 A1 | 9/2003 |
| WO | WO 2005/079443 A2 | 9/2005 |
| WO | WO 2006/097189 A1 | 9/2006 |
| WO | WO 2006/128407 A1 | 12/2006 |
| WO | WO 2007/085218 A1 | 8/2007 |

* cited by examiner

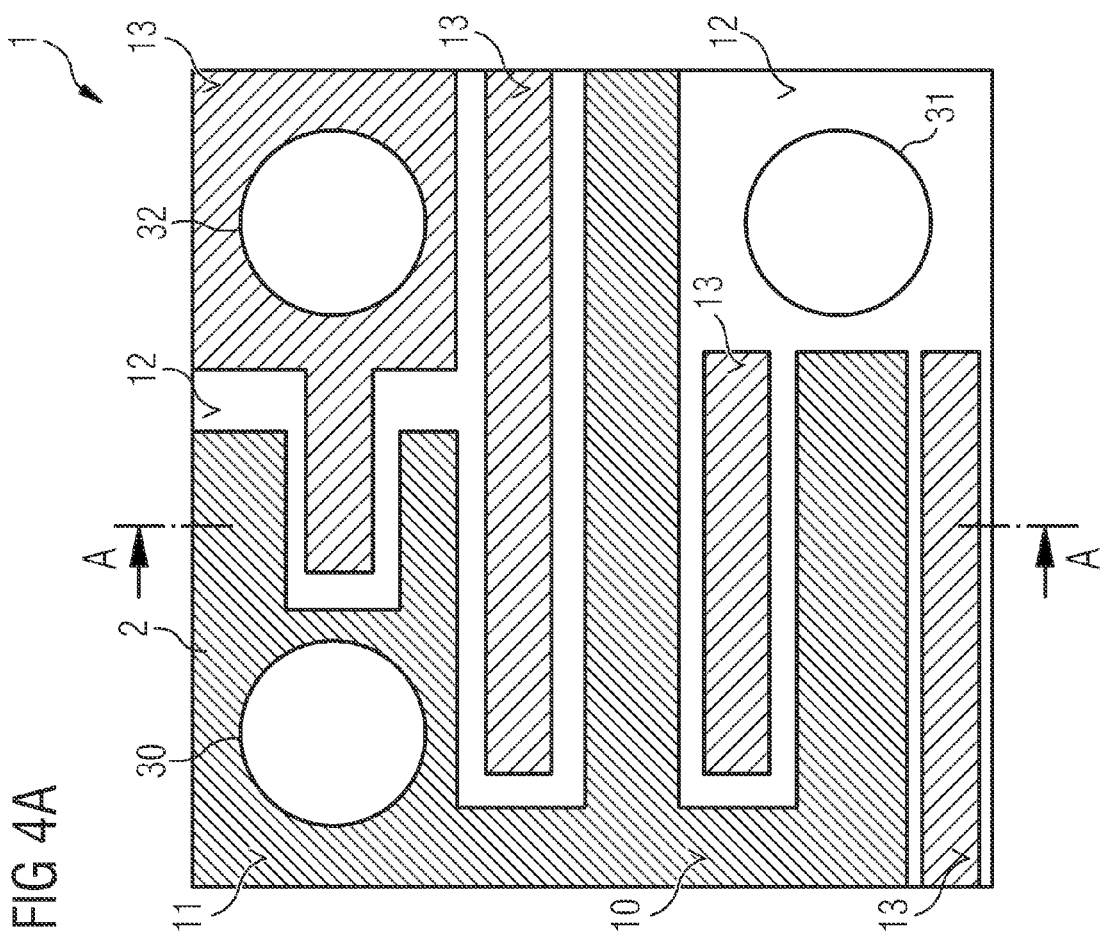

RADIATION RECEIVER AND METHOD OF PRODUCING A RADIATION RECEIVER

This patent application is a national phase filing under section 371 of PCT/DE2008/002126, filed Dec. 17, 2008, which claims the priority of German patent application 10 2008 006 987.6, filed Jan. 31, 2008, each of which is incorporated herein by reference in its entirety.

TECHNICAL FIELD

The present application relates to a radiation receiver and to a method of producing a radiation receiver.

BACKGROUND

In color sensors based on silicon, different color filters are generally used to measure color components in the spectral ranges red, green and blue. In addition, a further glass filter may be necessary, in order to filter infrared radiation. These external filters may entail high manufacturing costs and make it more difficult to produce compact components.

SUMMARY

In one aspect, the invention provides a compact radiation receiver with improved features and which is simple to produce. A method of producing such a radiation receiver is disclosed.

According to one embodiment, the radiation receiver includes a semiconductor body including a first active region and a second active region. The first active region and the second active region are provided in each case for detecting radiation. The first active region and the second active region are spaced vertically from one another. A tunnel region is arranged between the first active region and the second active region. The tunnel region is connected electrically conductively to a contact, which is provided between the first active region and the second active region for external electrical contacting of the semiconductor body.

The semiconductor body thus provides two active regions, in which, when the radiation receiver is in operation, in each case a signal may be generated for instance by generating and subsequently separating electron-hole pairs on impingement of electromagnetic radiation. By means of the contact, the signals may be picked off externally between the active regions.

By means of the tunnel region, an electrically conductive connection is simply formed between the contact and the active regions. In particular, the contact may be connected electrically conductively with the first active region and with the second active region. The contact may in this way constitute a common contact for the first active region and for the second active region. Between the active regions it is thus possible to dispense with in each case separate contacts for the active regions. Production of the radiation receiver is simplified in this way, which leads to reduced manufacturing costs and to a lower risk of misprocessing.

The radiation receiver may also comprise more than two active regions, which may in particular be integrated monolithically into the semiconductor body. In particular, the semiconductor body may comprise a third active region on the side of the second active region remote from the first active region. A further tunnel region may be arranged between the second active region and the third active region. The further tunnel region may be connected electrically conductively with a further contact.

In other words a tunnel region may thus be arranged between in each case two adjacent active regions, which tunnel region may additionally be connected in each case electrically conductively with a contact. In this way the semiconductor body is externally electrically contactable in each case between two adjacent active regions.

The tunnel region and/or the further tunnel region may in each case comprise at least two tunnel layers with mutually different conduction types. Thus a tunnel layer of the tunnel region or of the further tunnel region may be n-conductively doped and a further tunnel layer of the tunnel region or further tunnel region may be p-conductively doped. The tunnel layers may in each case be highly doped and in particular have a doping concentration of at least $1*10^{19}$ cm$^{-3}$, further of at least $1*10^{20}$ cm$^{-3}$. Production of an electrically conductive connection with the contact or further contact arranged outside the semiconductor body is thus simplified.

The tunnel layer, facing the contact, of the tunnel region may be of the same conduction type as the tunnel layer, facing the further contact, of the further tunnel region. The contact and the further contact may thus be of identical construction, in particular with regard to low contact resistance relative to the semiconductor body.

Furthermore, the contact and the further contact may be produced in a common deposition step. The production method is thus simplified.

At least one of the active regions may be arranged between a barrier layer and a counter barrier layer. In particular, the active regions may in each case be arranged between an associated barrier layer and an associated counter barrier layer.

The barrier layer and the counter barrier layer may in each case comprise mutually different conduction types. In addition, the active region may in each case be undoped or intrinsically doped. In this way, a PIN diode structure may be produced.

The barrier layers may comprise the same conduction type and be arranged in each case upstream of the associated active regions. In other words, the radiation receiver may comprise a structure of stacked diodes, wherein the polarity of the diodes relative to the main radiation entrance direction is in each case identical.

The semiconductor body may comprise a main radiation entrance face. By means of this main radiation entrance face, the majority of the radiation to be detected in the active regions may be coupled into the semiconductor body.

The main radiation entrance face of the semiconductor body may bound the semiconductor body in a vertical direction, i.e., in a direction extending perpendicular to a main plane of extension of the semiconductor layers of the semiconductor body.

The main radiation entrance face of the semiconductor body may additionally be of stepped construction. The main radiation entrance face may thus comprise a plurality of step faces. In case of doubt, a step face is understood to mean a face extending laterally, i.e., in a direction extending in a main plane of extension of the semiconductor layers of the semiconductor. Furthermore, a step face may be bounded laterally by at least one side face inclined or perpendicular relative to the main plane of extension.

In particular, a step face may be associated with each active region. The radiation to be detected in the respective active region may thus be coupled into the semiconductor body predominantly by the in each case associated step face. The radiation to be detected in each case in the active regions may thus impinge on the respective active region without having previously to pass through one of the upstream active regions.

In other words the radiation to be received in the respective active region passes predominantly through the step face, associated with this active region, of the main radiation entrance face into this active region. The active regions may in this way be designed to be largely independent of the other active regions arranged upstream thereof.

Furthermore, the relationships to one another of the signals generated in the active regions may be adjusted largely independently of the base area of the active regions by means of the relative proportions by area of the associated step faces. In particular, two active regions with mutually different base areas may thus generate signals of comparable level.

A main radiation entrance face of a semiconductor body is on the other hand not regarded as of stepped construction for the purposes of the application if it merely comprises recesses provided for contacting buried semiconductor layers and only a small radiation fraction, for instance 10% or less, is coupled in each case into the semiconductor body in the region of the recesses compared with the overall main radiation entrance face.

In the vertical direction one step face may in each case be provided between two adjacent active regions. Association of the step faces with the associated active regions is thus simplified.

In the case of a step face arranged between two active regions, the tunnel region may be removed at least in places. Absorption of the radiation to be detected in the active region arranged downstream of the tunnel region may be prevented in the region of the step face.

In one variant configuration in plan view at least two step faces are arranged in areal fashion, side by side. In particular, the step faces may be configured in such a way that, in plan view, a connecting line between any two desired points of one step face does not pass through another step face. For example, the step faces may in each case have a polygonal, for example, triangular or quadrangular basic shape. The step faces may be shaped in such a way that, for a given area, the step faces have as small as possible a total edge length. The risk that leakage currents arising along the edge may impair the sensitivity of the radiation receiver may be minimized in this way.

In an alternative configuration, at least two step faces engage in one another in places in plan view onto the semiconductor body. For example, one of the step faces may take the form of a comb, another step face extending at least in places into the interspaces. Through such an arrangement the step faces may be distributed comparatively homogeneously over the base area of the radiation receiver. In this way, even with spatially non-homogeneous irradiation of the radiation receiver the spectral fractions of the impinging radiation and in particular their ratio to one another may be reliably determined.

The first active region may be arranged upstream of the second active region. For the purposes of the application, the phrase "arranged upstream" refers in each case to the relative arrangement in a main radiation entrance direction. The phrase "arranged upstream" relative to the impinging radiation does not, however, mean that radiation impinging on one element of the radiation receiver has first of all to pass through an element arranged upstream of this element. For example, radiation impinging on the second active region may pass through the step face associated with this active region, without passing through the first active region arranged upstream.

The step face associated with the first active region may furthermore be continuous. This simplifies external electrical contacting of the first active region.

Furthermore, the step face associated with the second active region may surround the step face associated with the first active region at least in places. This makes it simpler for an area formed by means of the step face associated with the first active region and the step face associated with the second active region to be of continuous construction. External electrical contacting of the second active region, in particular by means of the contact, is thereby simplified.

In the case of a tunnel region which displays sufficient transparency for the radiation to be detected in the downstream active region or in the downstream active regions, the provision of a step face may be dispensed with. For all the active regions, the radiation may pass through a common, in particular unsegmented, main radiation entrance face. Before the radiation impinges on one active region, it in this case thus passes through the other active region(s) arranged upstream of the active region.

Furthermore, at least one of the active regions may be sensitive in the visible spectral range. At a peak wavelength in particular, the active regions may in each case comprise a detection maximum, wherein at least one peak wavelength lies in the visible spectral range. The peak wavelengths may be spaced from one another. For example, the radiation receiver may comprise three active regions, which comprise a peak wavelength in the red, green and blue spectral ranges.

Such a radiation receiver makes it simpler to produce a color sensor which generates a signal in each case for the three primary colors red, green and blue. By means of such a color sensor, it is possible, for example, to monitor the emission of a full-color display device. The color sensor may in particular be provided for adaptation of the relative intensities of the emitted radiation to a predetermined value, in particular for white balance.

Furthermore, at least one of the radiation receivers may be of a spectrally narrow-band construction. The less the spectral detection ranges of the active regions overlap, the more readily mutually separate color signals may be generated.

In particular, the distance between the peak wavelengths of two adjacent detection maxima may be greater than the total of the half-value widths in each case associated with these detection maxima. The half-value width is understood to mean half the spectral width at the level of half the maximum value (half width at half maximum, HWHM).

Furthermore, the peak wavelengths may increase along the main radiation entrance direction. For example, when viewed along the main radiation entrance direction the active regions have peak wavelengths in the blue, in the green and in the red spectral ranges.

In contrast to this, along the main radiation entrance direction at least one active region may comprise a lower peak wavelength than an upstream active region. The upstream active region may thus be absorbent with regard to the radiation with the lower peak wavelength. The radiation to be received in the downstream active region may be coupled in by the step face associated with this active region. The vertical sequence of active regions may thus be selected independently of the peak wavelengths thereof. On deposition of the semiconductor body the sequence of active regions may thus be optimized with regard to other criteria, for instance the lattice parameters of the semiconductor materials used in each case for the active regions.

Furthermore, a passive region may be arranged upstream of at least one of the active regions. In particular, the passive region may be provided for shaping a short wave edge of a spectral detection range of the associated active region. A passive region is understood to be a region in which radiation absorbed therein does not make any or at least makes no significant contribution to the signal of the associated active region. A passive region may, for example, be formed by means of a doped semiconductor layer, wherein however electron-hole pairs generated when the radiation appears are not separated from one another and subsequently recombine again.

In particular, the passive region may comprise a semiconductor layer whose band gap is greater than a band gap of a semiconductor layer of the associated active region. The short wave edge of the detection range of the active region may in this way be simply shaped. Any spectral overlap between two detection ranges may thus be reduced.

At least one of the active regions may contain a III-V compound semiconductor material. III-V compound semiconductor materials may display high absorption efficiency.

A material based on phosphide compound semiconductors is particularly suitable for detection in the visible spectral range.

"Based on phosphide compound semiconductors" means in this context that one semiconductor layer comprises a phosphorus-containing compound semiconductor, in particular $Al_nGa_mIn_{1-n-m}P$, wherein $0 \leq n \leq 1$, $0 \leq m \leq 1$ and $n+m \leq 1$. The following may also apply: $n \neq 0$ and/or $m \neq 0$. This material does not absolutely have to exhibit a mathematically exact composition according to the above formula. Instead, it may comprise one or more dopants and additional constituents which do not substantially modify the physical characteristics of the material. For simplicity's sake, however, the above formula includes only the fundamental constituents of the crystal lattice (Al, Ga, In, P), even if these may in part be replaced by small quantities of further substances.

An active region based on phosphide compound semiconductors may be distinguished by a high absorption efficiency in the visible spectral range, wherein at the same time sensitivity in the infrared spectral range may be low. It is thus possible to dispense with additional, external filters for blocking infrared radiation. The radiation receiver may accordingly be of particularly compact construction.

The active regions may differ from one another with regard to material composition. In particular, the active regions may have mutually different band gaps. Such active regions intrinsically display mutually different absorption behavior. Unlike with a spectrally broadband radiation receiver, for instance a silicon detector, separate filter layers for the selection of individual spectral ranges may be dispensed with. Suitable selection of the material composition of the semiconductor body thus simplifies the production of active regions, the spectral sensitivity of which lies predominantly in each case in a predetermined range.

The radiation receiver may be intended in particular for operation in a color sensor. A color sensor is generally understood to be a sensor which in each case supplies a signal for at least two mutually different spectral ranges. The spectral ranges do not necessarily have to lie in the visible spectral range.

The color sensor may comprise a plurality of color channels, for instance three or more color channels. The signal which may be picked off at the contacts of the radiation receiver may be supplied to an evaluation circuit of the color sensor.

In one variant configuration, one active region of the radiation receiver is individually contacted in each case for each color channel. The signals of the active regions may be picked off mutually independently, for instance in parallel or one after the other.

In an alternative variant configuration, the active regions of the radiation receiver may be contacted with regard to a common contact as reference contact, for instance with regard to a top contact or a bottom contact. The active regions may be connected to one another in series by means of the tunnel regions. The signals for the individual color channels may be generated in particular by means of an arithmetic operation, for instance a subtraction, from the signals which may be picked off at the contacts.

According to one embodiment of a method of producing a radiation receiver, a semiconductor body is provided. The semiconductor body comprises a first active region and a second active region, the active regions being intended in each case for the detection of radiation and a tunnel region being arranged between the first active region and the second active region. The tunnel region is exposed, by removing the first active region in places. A contact is formed on the exposed tunnel region. The radiation receiver is completed. The method steps do not necessarily have to be performed in the stated sequence.

This simplifies production of a semiconductor body, which may be contacted by way of the contact between the first active region and the second active region.

The semiconductor body may be deposited epitaxially, for example, by means of MOCVD or MBE, onto a growth substrate. During production the growth substrate may be thinned or removed. This may take place in each case over the entire surface or at least in places.

Furthermore, the tunnel region may be exposed by means of wet chemical etching. The tunnel region may serve as an etch stop. In other words, exposure may be effected by means of material-selective wet chemical etching. To this end the tunnel region is formed in particular by means of a material group which differs with regard to etching behavior from the material used for the active regions. In particular, the tunnel region and the active regions may be based on materials which contain mutually different group V materials. For example, at least one of the active regions, in particular all of the active regions, may be based on a phosphide compound semiconductor material. The tunnel region and optionally further tunnel regions may be based on an arsenide compound semiconductor material.

A semiconductor layer based on arsenide compound semiconductors contains an arsenic-containing compound semiconductor, in particular from the material system $Al_nGa_mIn_{1-n-m}As$, wherein $0 \leq n \leq 1$, $0 \leq m \leq 1$ and $n+m \leq 1$. The following may also apply: $n \neq 0$ and/or $m \neq 0$. This material does not absolutely have to exhibit a mathematically exact composition according to the above formula. Instead, it may comprise one or more dopants and additional constituents which do not substantially modify the physical characteristics of the material. For simplicity's sake, however, the above formula includes only the fundamental constituents of the crystal lattice (Al, Ga, In, As), even if these may in part be replaced by small quantities of further substances.

The semiconductor body may comprise a third active region on the side of the second active region remote from the first active region. A further tunnel region may be arranged between the second active region and the third active region. A contact may in each case be deposited on the tunnel region and the further tunnel region in a common deposition step. Production of the radiation receiver is thus simplified.

Deposition of a contact arranged outside the semiconductor body may proceed, for example, by means of sputtering or vapor deposition.

The above-described method is particularly suitable for producing a radiation receiver described further above. Features described in connection with the method may therefore also be referred to for the radiation receiver and vice versa.

BRIEF DESCRIPTION OF THE DRAWINGS

Further features, configurations and convenient aspects are revealed by the following description of the exemplary embodiments in conjunction with the Figures, in which:

FIGS. 4A and 4B show a third exemplary embodiment of a radiation receiver in schematic plan view (FIG. 4A) and associated schematic sectional view (FIG. 4B), FIGS. 5A and 5B respectively show first and second exemplary embodiments of a color sensor in each case in schematic representation.

Identical, similar and identically acting elements are provided with identical reference numerals in the Figures.

The figures are in each case schematic representations and are therefore not necessarily true to scale. Rather, comparatively small elements and in particular layer thicknesses may be illustrated on an exaggeratedly large scale for clarification.

DETAILED DESCRIPTION OF ILLUSTRATIVE EMBODIMENTS

Figure 1:
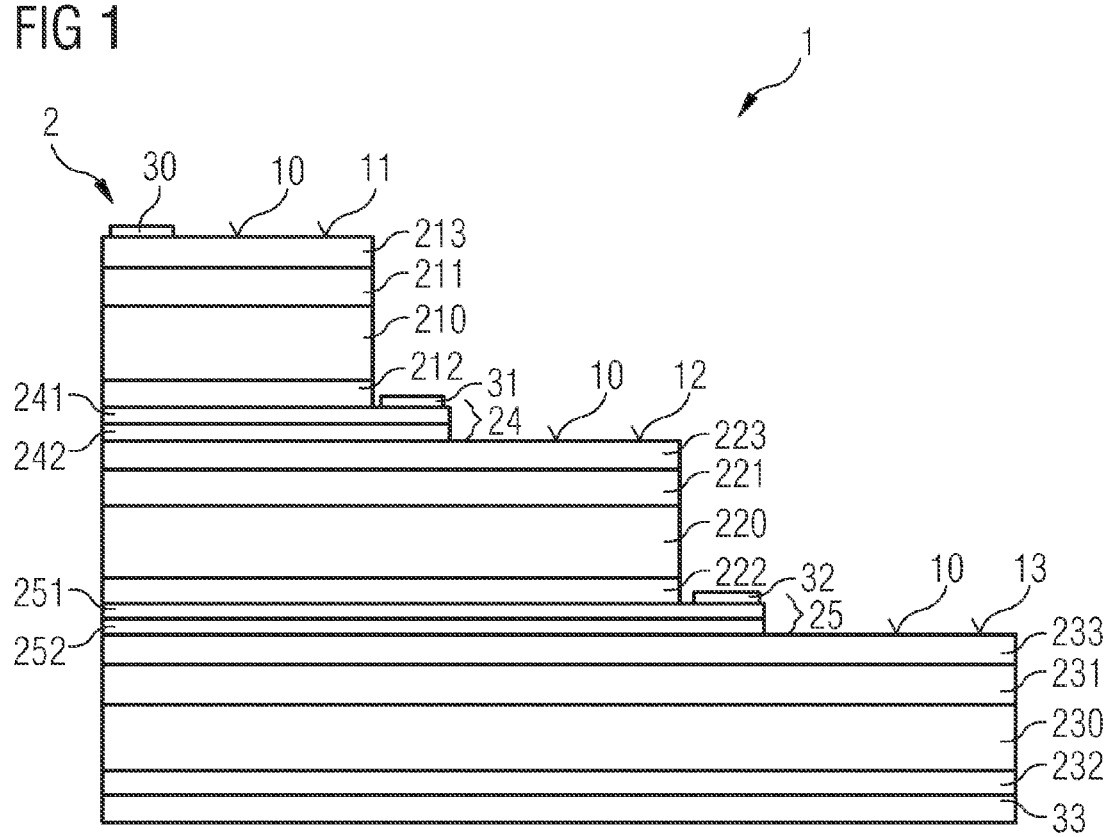
FIG. 1 is a schematic sectional view of a first exemplary embodiment of a radiation receiver.

In FIG. 1 a first exemplary embodiment of a radiation receiver 1 comprising a semiconductor body 2 is depicted. The semiconductor body 2 comprises a first active region 210, a second active region 220 and a third active region 230. The third active region 230 is arranged on the side of the second active region 220 remote from the first active region 210.

The active regions overlap partially when the semiconductor body is viewed in plan view. The first active region 210 covers the second active region 220 only in part. In addition, the second active region 220 covers the third active region 230 only in part.

The first active region 210 is arranged upstream of the second active region 220 in a main radiation entrance direction. In addition, the second active region 220 is arranged upstream of the third active region 230 in this direction.

Between two adjacent active regions, i.e., between the first active region 210 and the second active region 220 and between the second active region 220 and the third active region 230, there are respectively arranged a tunnel region 24 and a further tunnel region 25.

The tunnel region 24 projects laterally beyond the active region 210 at least in places. A contact 31 and a further contact 32 are respectively arranged on the tunnel region 24 and the further tunnel region 25. The contact and the further contact are provided for external electrical contacting of the semiconductor body 2 between the respective active regions between which the tunnel regions are arranged.

The contacts are conveniently electrically conductive and may contain a metal, for instance Au, Ti, Ni, Pt, Ag, Rh or Al, or a metallic alloy, in particular with at least one of the stated metals, or consist of such a metal or such a metallic alloy. The contacts may furthermore also be of multilayer construction.

A top contact 30 is arranged on the side of the first active region 210 remote from the tunnel region 24. A bottom contact 33 is furthermore arranged on the side of the third active region 230 remote from the second active region 220. Thus, each active region comprises a contact on each side, whereby a signal generated in the active region when the radiation receiver 1 is in operation is in each case externally accessible from both sides of the active region.

The semiconductor body 2 comprises a main radiation entrance face 10, which is of stepped construction. A step face is associated with each active region, by means of which the radiation to be received in the respective active region is coupled into the semiconductor body 2. The step faces each extend laterally and parallel to one another.

A first step face 11 is associated with the first active region 210, a second step face 12 is associated with the second active region 220 and a third step face 13 is associated with the third active region 230. In the vertical direction, i.e., in a direction extending perpendicularly to a main plane of extension of the semiconductor layers of the semiconductor body 2, the step faces are in each case arranged staggered relative to one another. In the lateral direction the step faces extend without overlap.

One step face is formed in each case between two adjacent active regions. In this way the radiation to be received in the third active region 230 may, for example, be coupled in via the step face 13 and thus does not have to pass through the upstream active regions 210 and 220. The active regions of the semiconductor body 2 may in this way be largely mutually independently adapted to a spectral sensitivity characteristic predetermined in each case for the active region. The spectral sensitivity of the active regions is thus independent or at least largely independent of further active regions optionally arranged upstream of the respective active region.

The sensitivities of the individual active regions 210, 220, 230 may be matched to one another and in particular adapted to one another by way of the proportion by area of the respective step faces 11, 12, 13 to the overall main radiation entrance face 10.

The active regions 210, 220, 230 are in each case arranged between a barrier layer 211, 221, 231 and a counter barrier layer 212, 222, 232, the barrier layers in each case being arranged upstream of the associated active regions.

The active regions 210, 220, 230 may be of intrinsic or undoped construction. Electron-hole pairs generated in the active regions may in this way be separated from one another and reach the respective contacts 30, 31, 32, 33 via the respective barrier layers or counter barrier layers.

The barrier layers are in each case p-conductively doped and the counter barrier layers are in each case n-conductively doped. The radiation receiver 1 may in this way be constructed in the manner of stacked, monolithically integrated PIN diodes, wherein each diode is externally electrically contactable by way of the contacts on each side of the active region.

The tunnel region 24 and the further tunnel region 25 in each case include a first tunnel layer 241 and a first further tunnel layer 251 respectively and a second tunnel layer 242 and a second further tunnel layer 252 respectively, which include mutually different conduction types. The first tunnel layer 241 or 251 in each case displays the same doping as the counter barrier layer 212 or 222 respectively located nearest thereto and the second tunnel layer 242, 252 displays the same doping as the barrier layer 221, 231 located nearest thereto.

This therefore makes it simpler for charge carriers from both sides of the tunnel region 24 or of the further tunnel region 25 to reach the contact 31 or the further contact 32 respectively.

The signals from three active regions are externally accessible via a total of four contacts by means of the tunnel regions 24, 25. For example, via the tunnel region 24 charge carriers from the first region 210 may reach the contact 31, where they may be picked off, in particular through the counter barrier layer 212, as may charge carriers from the second active region 220, in particular through the counter barrier layer 222. Separate contacts for the barrier layer and for the counter barrier layer are thus not necessary between two active regions. A separate exposure of the barrier layer and the counter barrier layer, for instance by two separate etching steps to different etching depths, may be dispensed with. In particular, the number of necessary etching steps may thereby be reduced.

The tunnel regions 24, 25 may thus reduce both the number of contacts and the number of etching steps. Production of the radiation receiver 1 is thereby simplified and the risk of incorrect production is thereby reduced. Furthermore, the proportion of the surface area of the radiation receiver which is shaded by contacts is reduced. The radiation may in this way be better coupled into the radiation receiver.

The tunnel layers 241, 242, 251, 252 may in each case be highly doped, for instance with a doping concentration of at least $1*10^{19}$ cm$^{-3}$, in particular at least $1*10^{20}$ cm$^{-3}$.

As a result of the high level of doping, the tunnel layers have comparatively high transverse conductivity. The tunnel region, in particular the tunnel layers, thus makes easier supply of the charge carriers released in the active regions by generation of electron-hole pairs to the contact 31 or to the further contact 32 respectively. The currents arising may lie in particular in the range of a few microamperes.

Additional contact finger structures formed outside the semiconductor body 2 may be dispensed with. Production of the radiation receiver is thus simplified. Optionally, however, such contact finger structures may additionally be provided.

The first tunnel layer 241 of the tunnel region 24 and the first further tunnel layer 251 of the further tunnel region 25 have the same conduction type. An ohmic connection to the respective contacts 31 or 32 may thus be achieved with contacts of identical construction. External electrical contacting of the semiconductor body 2 between the active regions is thus simplified.

A passive region, i.e., a first passive region 213, a second passive region 223 or a third passive region 233, is in each case arranged upstream of the active regions 210, 220, 230. The passive regions 213, 223, 233 in each case comprise the same doping as the adjacent barrier layer 211, 221 or 231.

Unlike with the active regions 210, 220, 230, absorption in the passive regions does not lead to generation of a signal, or at least not significantly. The passive regions may thus in each case fulfill the function of a filter layer integrated monolithically into the semiconductor body. As a result of the purposeful absorption in the passive regions, spectral sensitivity may be adjusted for the in each case associated active region. Spectral separation of the detection ranges of the active regions is thus simplified.

Unlike in the exemplary embodiment illustrated, the passive layers may also be dispensed with.

Also unlike in the described exemplary embodiment, semiconductor layers, in particular the barrier layers, the counter barrier layers, the tunnel layers and the passive regions may also be reversed with regard to their conduction type, i.e. the n-conductively doped semiconductor layers may be p-conductively doped and vice versa.

Furthermore, the active regions may also be formed by means of a space-charge zone, which may occur at a pn-junction. A separate, intrinsically or undoped layer between the respective barrier layer and the associated counter barrier layer is unnecessary.

In addition, the radiation receiver may also comprise just two active regions or more than three active regions.

It is additionally possible to dispense with a stepped construction of the main radiation entrance face. In this case the radiation may be coupled into the active regions predominantly via a common, in particular non-segmented, radiation entrance face. It is thus possible, with a semiconductor body of the same size, for the area usable for each active region for radiation incoupling to be enlarged relative to the stepped construction. For contacting of the active regions, the upstream active regions may be removed in only comparatively small regions, in order to expose the respective tunnel regions and provide contacts on the exposed tunnel regions. Such a configuration is particularly convenient if the radiation provided for detection is absorbed only in a sufficiently small proportion in the layers upstream of the respective active region, for instance in another upstream, active region or an upstream tunnel region.

Unlike in the exemplary embodiment shown, the semiconductor body 2 may be arranged on a support. This support may, for example, be formed by means of a growth substrate for the semiconductor layers of the semiconductor body 2. The growth substrate may be removed in places or removed or thinned in places. The bottom contact may be arranged on the side of the growth substrate remote from the semiconductor body 2.

The above-described structure of the radiation receiver is particularly suitable for a color sensor which in each case generates one signal for mutually different spectral detection ranges. The detection ranges may in particular lie in the ultraviolet, in the visible or in the infrared spectral range.

The semiconductor body 2, in particular the active regions 210, 220, 230, may be based on a III-V compound semiconductor material.

For the detection of radiation in the visible spectral range, for example, of a color triple, for instance in the red, green and blue spectral range, active regions are particularly suitable which are based on a phosphidic compound semiconductor material, in particular on $Al_nGa_mIn_{1-n-m}P$, wherein $0 \le n \le 1$, $0 \le m \le 1$ and $n+m \le 1$. By suitable selection of the material composition for the active regions 210, 220, 230 and optionally the associated passive regions 213, 223, 233, the spectral sensitivity of the radiation receiver may be adjusted within broad limits.

Figure 2:
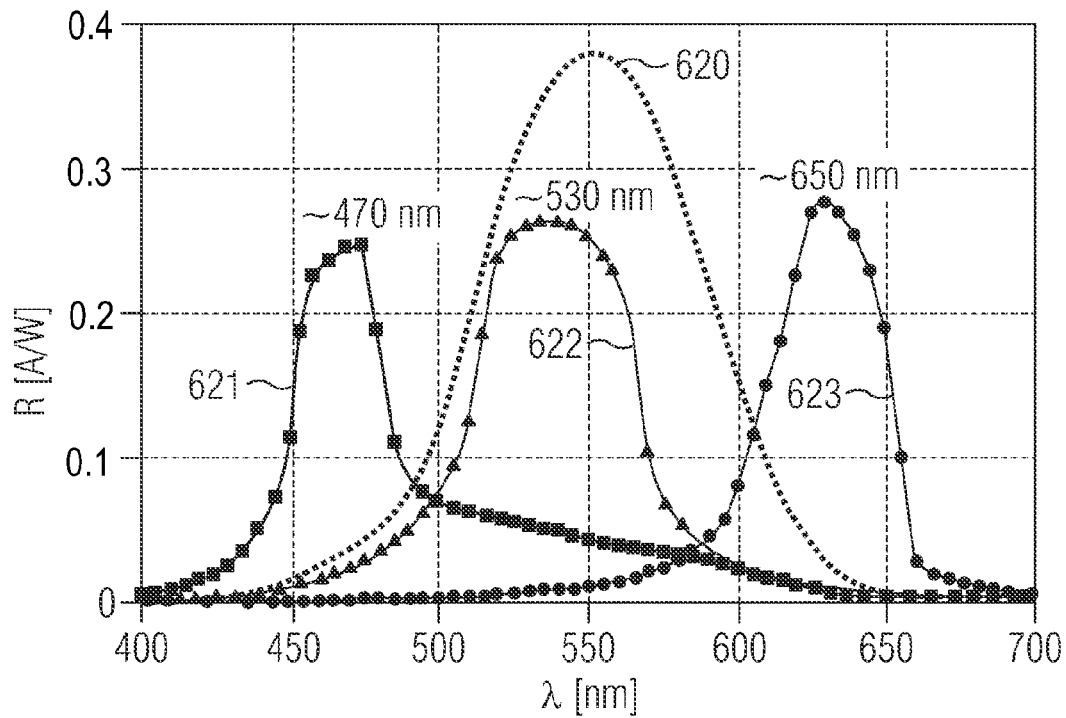
FIG. 2 shows the responsivities of the active regions in each case as a function of the wavelength of the impinging radiation for a radiation receiver according to the first exemplary embodiment.

An example of the spectral sensitivity of a radiation receiver which is constructed as described in relation to FIG. 1 is shown in FIG. 2. The curves 621, 622 and 623 show in each case the responsivity of a detector in the blue, green and red spectral ranges as a function of the vacuum wavelength λ of the radiation impinging on the radiation receiver.

In comparison, the curve 620 shows the spectral sensitivity distribution of the human eye ($V_\lambda$-curve).

The first active region provided for the detection of blue radiation is based on AlInP. A passive region 213, based on GaP, is associated with the first active region 210. The peak wavelength of the first active region is approx 470 nm.

The second active region 220, which is provided for the detection of radiation in the green wavelength range, is based on AlGaInP with an aluminum content of n=0.5. A passive region 223 based on AlGaInP with an aluminum content of n=0.80 is arranged upstream of this active region. The peak wavelength of the second active region is approx 530 nm.

The third active region 230 provided for the detection of red radiation is based on GaInP. The associated passive region 233 is based on AlGaInP with an aluminum content of n=0.30. The peak wavelength of the third active region is approx 640 nm.

The passive regions in each case comprise a band gap, which is larger than the band gap of the active region with which it is in each case associated. The short wave edge of the respective responsivity spectrum may thus be purposefully adjusted by absorption of the shorter wave radiation in the associated passive region.

Furthermore FIG. 2 shows that the spectral detection ranges of the active regions 210, 220, 230 have only comparatively slight overlap. The spectral detection ranges are in each case of narrowband construction, such that the spectral distance between two adjacent peak wavelengths is greater than the sum of the half-widths at half maximum associated with these detection ranges.

Unlike in the described exemplary embodiment, the peak wavelengths of the active regions do not necessarily increase in the main radiation entrance direction. Instead, at least one active region may have arranged upstream of it another active region with a higher peak wavelength.

The tunnel regions 24, 25 may here be based on $Al_xGa_{1-x}As$ with $0 \leq x \leq 1$. The material composition of all or at least some of the phosphidic semiconductor layers may be selected such that they are lattice-matched or at least largely lattice-matched to the arsenidic tunnel regions. To this end, the phosphidic semiconductor layers may comprise an indium content of approx 50%.

Figure 3:
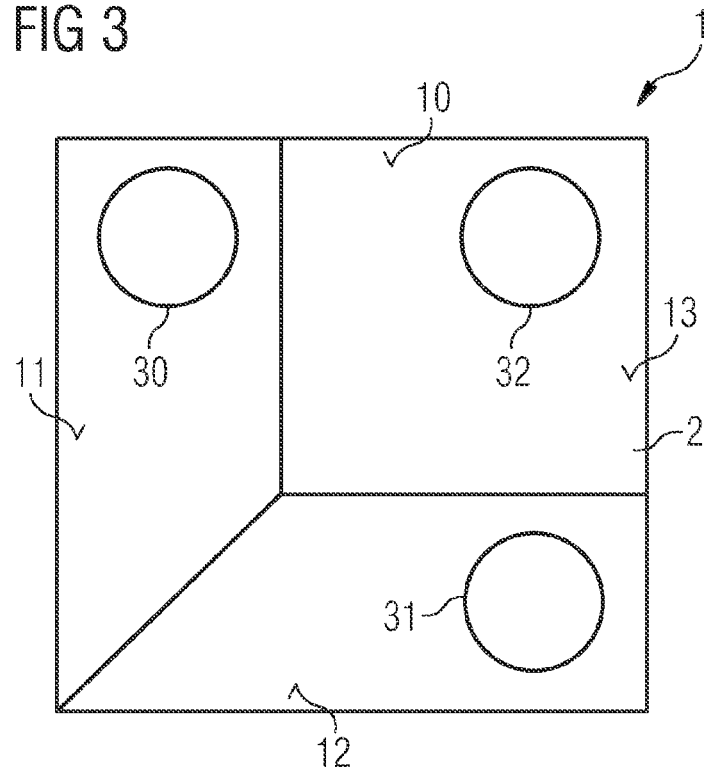
FIG. 3 is a schematic plan view of a second exemplary embodiment of a radiation receiver.

FIG. 3 is a schematic plan view of a second exemplary embodiment of a radiation receiver 1. In the vertical direction the radiation receiver 1 may be constructed as described in relation to FIG. 1.

The main radiation entrance face 10 is stepped and comprises a first step face 11, a second step face 12 and a third step face 13. Through the step faces the radiation may be coupled into the active regions associated with the respective step faces.

The step faces are arranged adjacent to one another in the same plane. A connecting line between any two desired points of one step face does not pass through another step face. The step faces may also have other comparatively simple geometric basic shapes, in particular polygonal, for instance triangular or quadrangular basic shapes.

The step faces may in particular be shaped such that the sum of the boundary lines between the step faces is minimized. The risk of leakage currents arising at the boundary faces and of associated reduced sensitivity of the radiation receiver may in this way be largely minimized.

A third exemplary embodiment of a radiation receiver 1 is shown in FIGS. 4A and 4B in schematic plan view and associated sectional view along line AA'. The multilayer structure of the semiconductor body 2 may be as described in relation to FIGS. 1 and 2. To simplify the illustration, the passive regions are not shown in the sectional view shown in FIG. 4B. However, these may be provided and constructed as described in relation to FIGS. 1 and 2.

Unlike in the exemplary embodiment shown in FIG. 3, in this exemplary embodiment the step faces are arranged such that the step faces are distributed with greater uniformity over the main radiation entrance face 10. In the case in particular of spatially non-homogeneous irradiation of the radiation receiver 1 this simplifies generation of a reliable signal. Improved spatially homogeneous sensitivity distribution may be achieved without the manufacturing effort being significantly increased over the exemplary embodiment described in relation to FIG. 3.

The first step face 11 associated with the first active region 210 is of continuous construction. In this way, the signal generated in the first active region may be more simply picked off via the top contact 30.

The second step face 12 associated with the second active region 220 surrounds the first step face 11 in the inner region of the main radiation entrance face 10. In other words the second step face adjoins the first step face. The area formed jointly by the first step face and the second step face is thus continuous. External contacting of the radiation receiver by means of the first contact 31 is thus simplified. In addition, when the radiation receiver is produced, greater manufacturing tolerances are thus achieved when forming the step faces.

The third step face 13 associated with the third active region 230 engages at least in places in the first step face 11 associated with the first active region 210. The third step face 13 does not have to be of continuous construction. Instead, it may comprise island-like sub-regions, since the further tunnel layer 25 does not have to be cut through even when producing island-like regions of the third step face 13.

Spatially homogeneous distribution of the sensitivity of the active regions 210, 220, 230 over the main radiation entrance face 10 is thus simplified.

The step faces may be of strip-form construction at least in places. In particular, at least one step face, such as for instance the first step face 11 shown in the exemplary embodiment, may be of comb-like construction.

Depending on the lateral extent of the radiation receiver, the strips may have a width of between approx 8 µm and 100 µm, in particular between 8 µm and 50 µm inclusive. The center-to-center distance between two adjacent strips of a step face may here amount, for example, to twice the strip width. The minimum strip width is dependent in particular on manufacturing tolerances, for instance the adjustment tolerance in different photolithographic steps and the undercut etching which arises in wet chemical manufacturing processes.

Figure 5A:
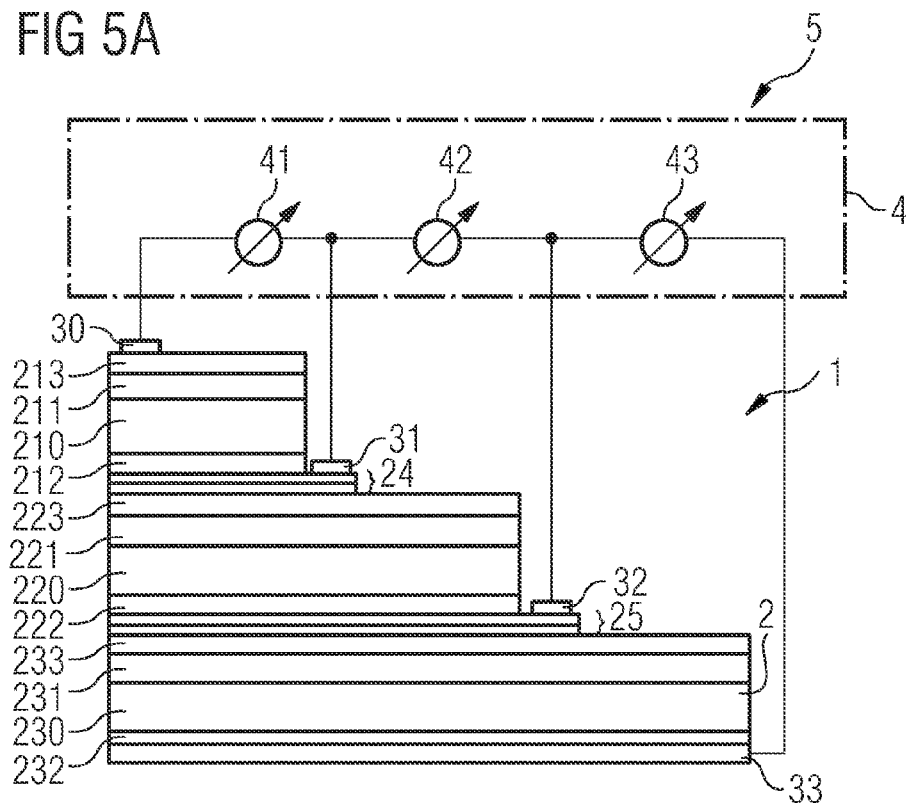

FIG. 5 shows a first exemplary embodiment of a color sensor 5. The color sensor comprises a radiation receiver 1, which may be constructed as described in particular in relation to FIGS. 1 to 4B.

The color sensor 5 comprises an evaluation circuit 4, which comprises a first evaluation unit 41, a second evaluation unit 42 and a third evaluation unit 43. Each evaluation unit is connected with in each case two contacts, wherein the contacts are arranged in each case on different sides of the respective active region and in each case constitute the nearest contact on each side of the active region. For example, the first evaluation unit 41 is connected electrically conductively with the top contact 30 and the contact 31. The active regions may be operated in each case by means of a bias voltage or photovoltaically. The signals of the active regions may be picked off in sequence or in parallel.

Each evaluation unit is intended to output a signal for in each case one color channel.

Figure 5B:
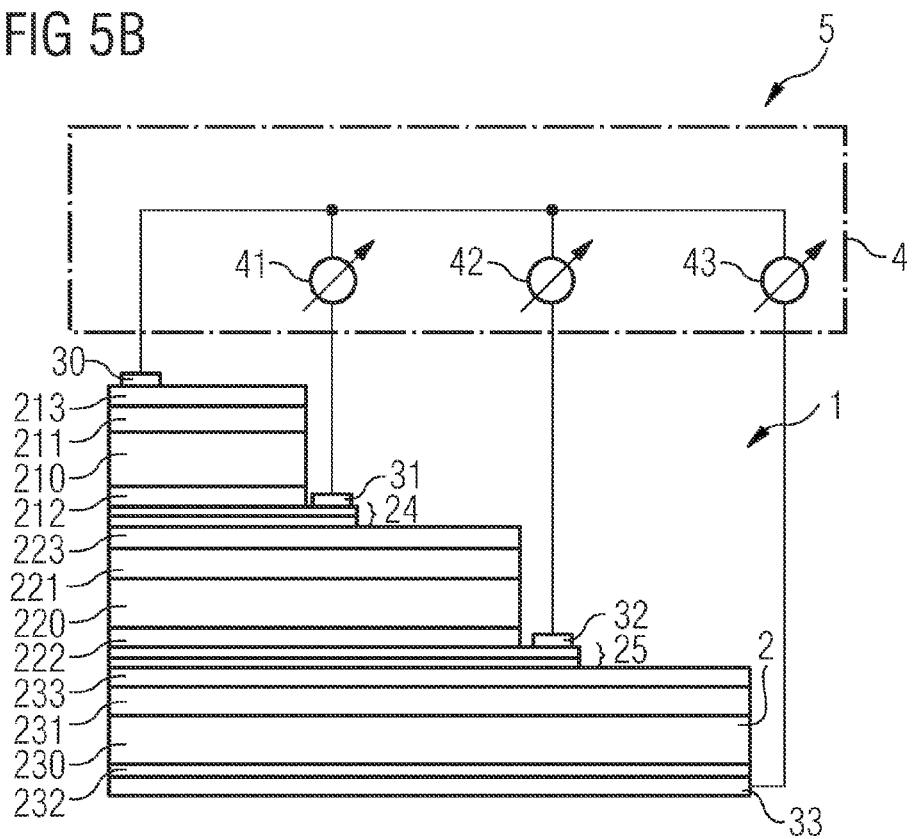

A second exemplary embodiment of a color sensor is shown in FIG. 5B. Unlike with the color sensor described in relation to FIG. 5A, the evaluation units 41, 42, 43 are connected electrically conductively with a common contact as reference contact. In the exemplary embodiment shown, the common electrical contact is the top contact 30.

In this case the active regions 210, 220, 230 are connected together electrically in series by means of the tunnel regions 24, 25. The corresponding signal may be generated for each color channel by means of the evaluation units from the signal picked off at the contacts, for instance by means of an arithmetic operation such as differentiation.

One exemplary embodiment of a method of producing a radiation receiver is illustrated schematically in sectional view by way of the intermediate steps shown in FIGS. 6A to 6F.

Figure 6A:
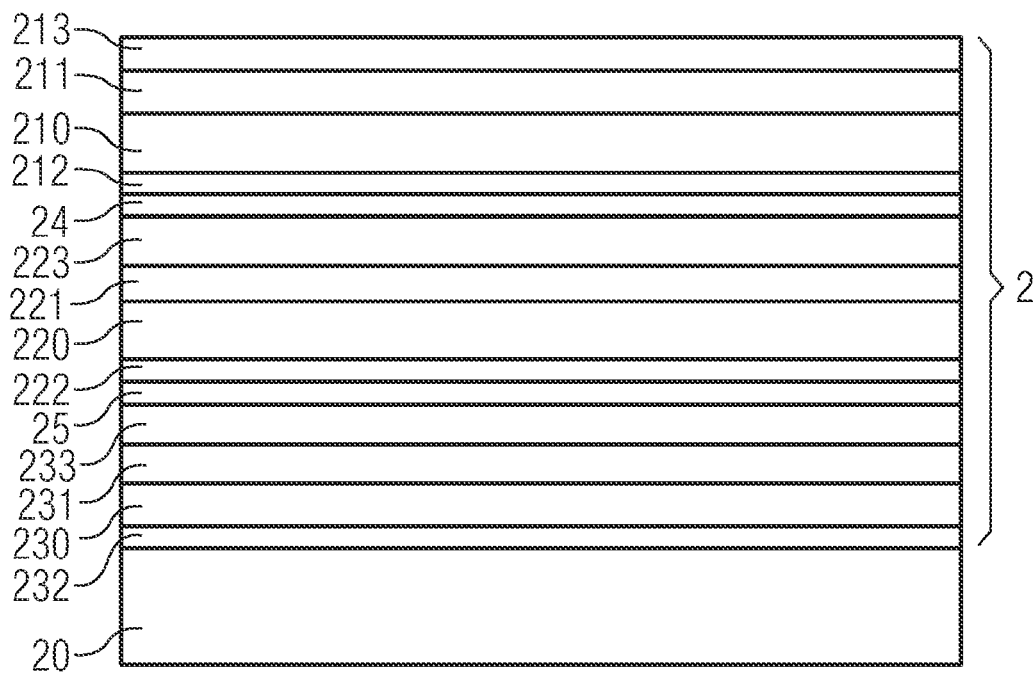
FIGS. 6A to 6F show a first exemplary embodiment of a method of producing a radiation receiver, by means of intermediate steps shown schematically in sectional view.

As is shown in FIG. 6A, a semiconductor body 2 with a semiconductor layer sequence is provided. The semiconductor layer sequence of the semiconductor body may be deposited epitaxially on a growth substrate 20, for instance using MBE or MOVPE. The semiconductor layer sequence may be constructed as described in relation to FIG. 1.

The method is shown merely for simplified illustration of the production of an individual radiation receiver. It goes without saying that with the described method a plurality of radiation receivers may be produced together and then subsequently singulated. Singulation may take place, for example, mechanically, for instance by means of sawing, cutting or breaking, or chemically, for instance by means of wet chemical or dry chemical etching. A laser separation method may also be used.

Figure 6B:
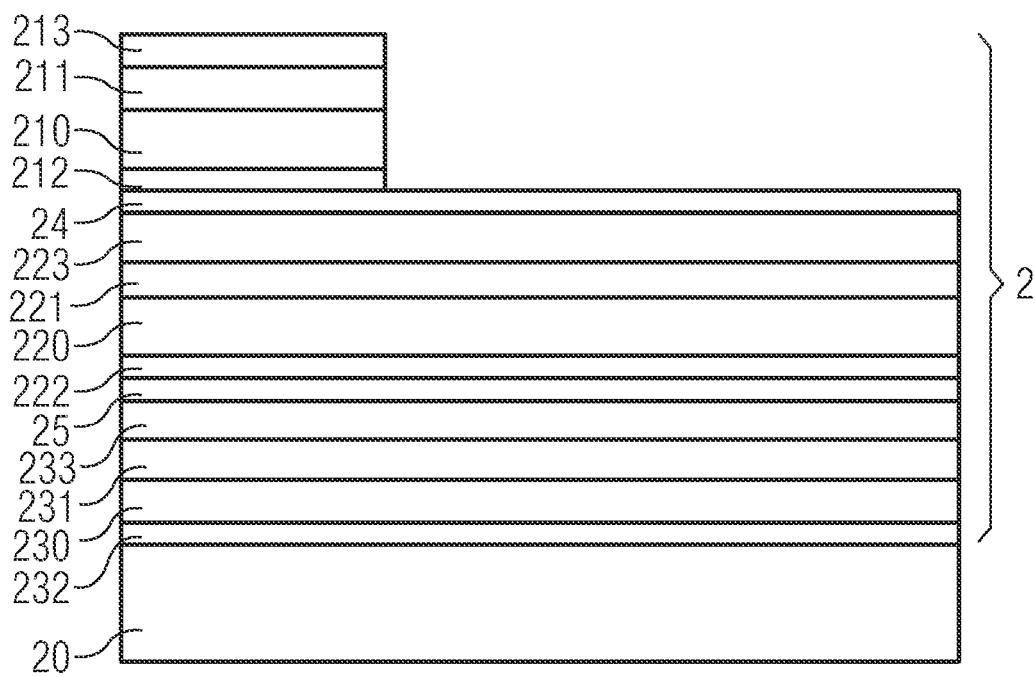

As shown in FIG. 6B, the tunnel region 24 arranged between the first active region 210 and the second active region 220 is exposed in places. This is effected by removing material of the semiconductor layers thereabove in places, in particular from the first active region 210.

Material may be removed in particular by means of wet chemical etching. In this case the tunnel region 24 may be constructed such that it serves as an etch stop. For example, phosphidic semiconductor materials and arsenidic semiconductor materials may exhibit high selectivity with regard to a wet chemical etching process. For instance, etching using hydrogen chloride (HCl) may effectively remove phosphidic semiconductor material and stop with a high selectivity at arsenidic material.

Figure 6C:
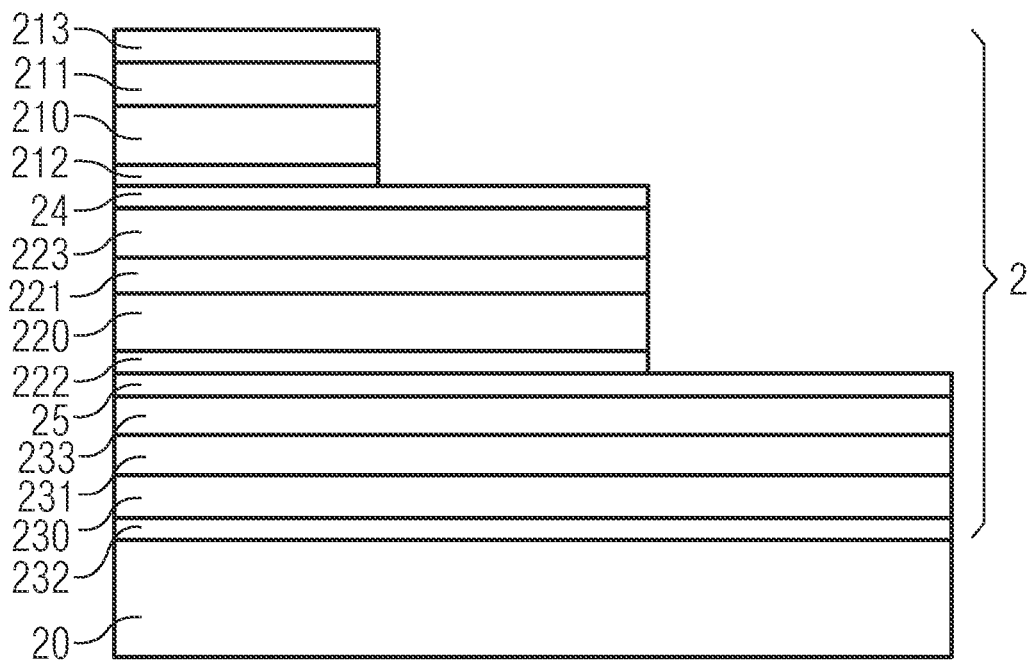
Figure 6D:
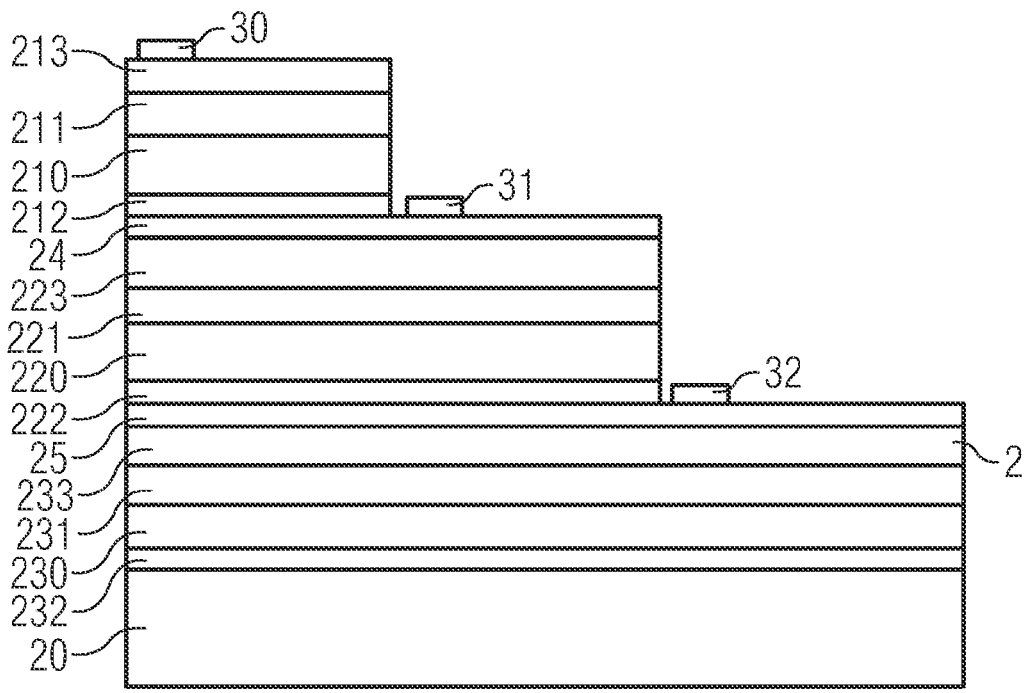

As is shown in FIG. 6C, the further tunnel region 25, which is arranged between the second active region 220 and the third active region 230, is then exposed in places. This may take place as described in relation to FIG. 6B.

A contact may then in each case be deposited on the exposed regions of the tunnel region 24 or of the further tunnel region 25. This may take place in a joint deposition process, for which vapor deposition or sputtering are suitable, for example. A multilayer configuration of the contacts may also be provided. Furthermore, a top contact 30 is deposited on the passive region 213 associated with the first active region 210. This may be effected jointly with the contact 31 and the further contact 32 or be carried out in a separate deposition step.

Figure 6E:
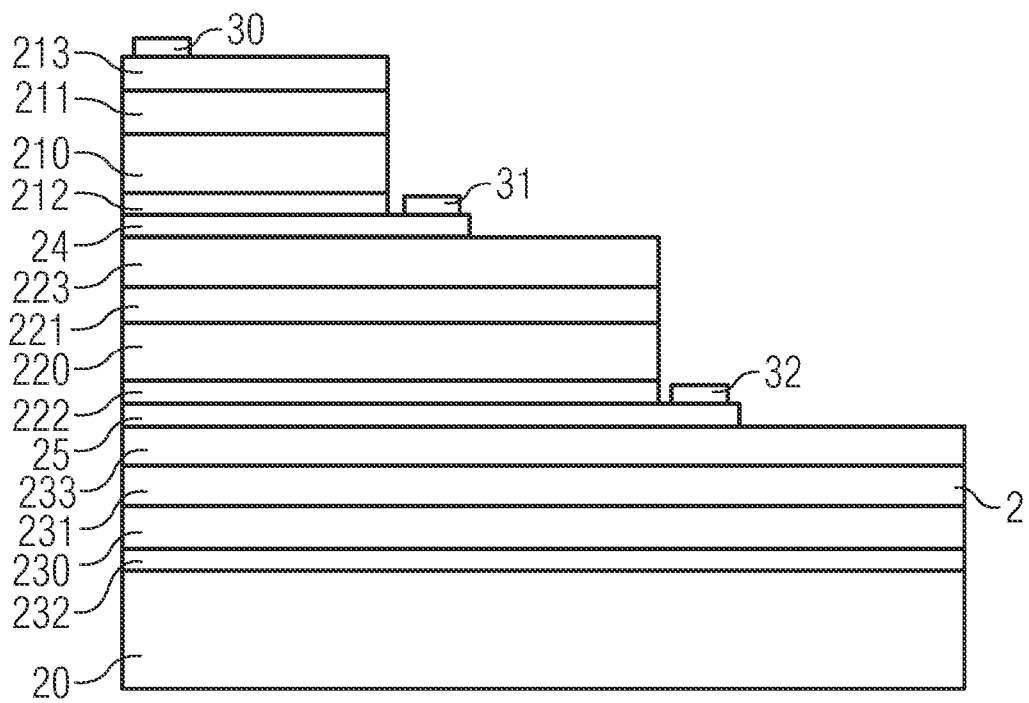

As shown in FIG. 6E, the tunnel region 24 and the further tunnel region 25 are removed in places. In this way, the passive regions 223 or 233 respectively associated with the respective active regions 220, 230 may be exposed. The tunnel regions may therefore be configured to be absorbent with regard to the radiation to be detected in the active regions therebelow.

In the case of tunnel regions which are constructed in such a way that they are transparent to the radiation to be detected in the active regions therebelow, it is possible to dispense with this removal in places of the tunnel regions.

Figure 6F:
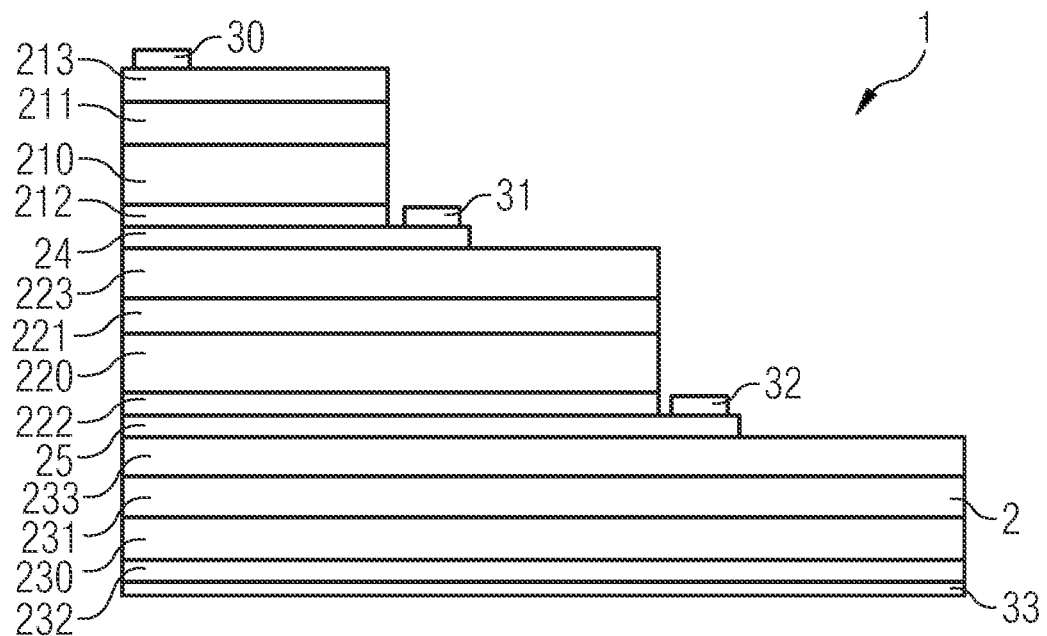

The growth substrate 20 is removed, as shown in FIG. 6F. The bottom contact 33 may be deposited on the face of the semiconductor body thus exposed. The bottom contact may be deposited as described in relation to the contacts 30, 31, 32.

Furthermore, the semiconductor body 2 may be provided at least in places with a protective layer (not shown explicitly). This may cover in particular the exposed side faces of the semiconductor body. The protective layer may, for example, contain an oxide, for instance silicon oxide or titanium oxide, a nitride, for instance silicon nitride, or an oxynitride, for instance silicon oxynitride.

In contrast to the exemplary embodiment shown, the radiation receiver may also at least in part retain the growth substrate 20. The growth substrate 20 may in particular also be removed only in places or thinned over the entire surface or in places. Furthermore, the production steps may also be performed differently from the described sequence, insofar as is convenient.

The invention is not restricted by the description given with reference to the exemplary embodiments. Rather, the invention encompasses any novel feature and any novel combination of features, including in particular any combination of features in the claims, even if this feature or this combination is not itself explicitly indicated in the claims or the exemplary embodiments.

The invention claimed is:

1. A radiation receiver comprising:
a first active region and a second active region disposed in a semiconductor body, the second active region spaced vertically from the first active region, the first and second active regions each provided for the detection of radiation, wherein the first active region and the second active region are each arranged between a barrier layer and a counter barrier layer, wherein the barrier layer and the counter barrier layer have mutually different conduction types;
a tunnel region arranged between the first active region and the second active region, wherein the tunnel region comprises a first tunnel layer and a second tunnel layer having mutually different conduction types, wherein the first tunnel layer and the second tunnel layer project in lateral direction beyond the first active region; and
a contact between the first active region and the second active region for external electrical contacting of the semiconductor body the tunnel region being electrically connected with the contact, wherein the contact is arranged directly on a portion of the tunnel region that projects laterally beyond the first active region.

2. The radiation receiver according to claim 1, further comprising:
a third active region on a side of the second active region remote from the first active region;
a further tunnel region arranged between the second active region and the third active region; and
a further contact electrically conductively connected with the further tunnel region.

3. The radiation receiver according to claim 1, wherein the tunnel region comprises two tunnel layers with mutually different conduction types.

4. The radiation receiver according to claim 1, wherein a main radiation entrance face of the semiconductor body is of stepped construction and one step face of the main radiation entrance face is associated with each active region, a step face disposed between two adjacent active regions.

5. The radiation receiver according to claim 4, wherein, in plan view, at least two step faces are arranged in areal fashion side by side.

6. The radiation receiver according to claim 4, wherein, in plan view, at least two step faces engage in one another in places.

7. The radiation receiver according to claim 4, wherein is arranged upstream of the second active region in a main radiation entrance direction, a first step face associated with the first active region being of continuous construction.

8. The radiation receiver according to claim 2, wherein the first, second and third active regions each comprise a detection maximum at a peak wavelength and the peak wavelengths are spaced from one another, the peak wavelengths increasing in the main radiation entrance direction.

9. The radiation receiver according to claim 2, wherein the first, second and third active regions each comprise a detection maximum at a peak wavelength and the peak wavelengths are spaced from one another, at least one active region having a lower peak wavelength than an active region arranged upstream in the main radiation entrance direction.

10. The radiation receiver according to claim 1, further comprising a passive region arranged upstream of at least one active region the passive region provided for shaping a short wave edge of a spectral detection range associated with the at least one active region.

11. The radiation receiver according to claim 1, wherein at least one of the active regions contains a III-V compound semiconductor material.

12. The radiation receiver according to claim 1, which is provided for operation in a color sensor, the color sensor comprising a plurality of color channels.

13. A method of producing a radiation receiver, the method comprising:
   providing a semiconductor body comprising a first active region and a second active region, each active region provided for detecting radiation, wherein the first active region and the second active region are each arranged between a barrier layer and a counter barrier layer that have mutually different conduction types, the semiconductor body further comprising a tunnel region arranged between the first active region and the second active region, wherein the tunnel region comprises a first tunnel layer and a second tunnel layer having mutually different conduction types, wherein the first tunnel layer and the second tunnel layer project in lateral direction beyond the first active region;
   exposing the tunnel region the first active region being removed in places; and
   forming a contact directly on the tunnel region.

14. The method according to claim 13, wherein providing the semiconductor body comprises providing a semiconductor body that is deposited epitaxially on a growth substrate.

15. The radiation receiver according to claim 1, wherein the first and second active regions each comprise a detection maximum at a peak wavelength and the peak wavelengths are spaced from one another, the peak wavelengths increasing in the main radiation entrance direction.

* * * * *

UNITED STATES PATENT AND TRADEMARK OFFICE
CERTIFICATE OF CORRECTION

PATENT NO. : 8,659,107 B2  Page 1 of 1
APPLICATION NO. : 12/746121
DATED : February 25, 2014
INVENTOR(S) : Butendeich et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 120 days.

Signed and Sealed this

Twenty-ninth Day of September, 2015

Michelle K. Lee
*Director of the United States Patent and Trademark Office*